(12) United States Patent
Chen et al.

(10) Patent No.: US 7,115,509 B2
(45) Date of Patent: Oct. 3, 2006

(54) METHOD FOR FORMING POLYSILICON LOCAL INTERCONNECTS

(75) Inventors: Chun Chen, Boise, ID (US); Guy Blalock, Eagle, ID (US); Graham Wolstenholme, Boise, ID (US); Kirk Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 120 days.

(21) Appl. No.: 10/714,752

(22) Filed: Nov. 17, 2003

(65) Prior Publication Data

US 2005/0104114 A1    May 19, 2005

(51) Int. Cl.
*H01L 21/44*    (2006.01)
(52) U.S. Cl. ............ 438/684; 438/253; 438/396; 438/745
(58) Field of Classification Search ......... 438/396, 438/199–201, 211, 233, 253, 257, 523, 592–593, 438/684, 745, 753
See application file for complete search history.

(56) References Cited

U.S. PATENT DOCUMENTS

| | | | |
|---|---|---|---|
| 5,416,048 A | 5/1995 | Blalock | |
| 5,892,285 A | 4/1999 | Gonzalez | |
| 5,937,287 A | 8/1999 | Gonzalez | |
| 5,945,348 A | 8/1999 | Blalock | |
| 6,001,685 A * | 12/1999 | Kim | 438/253 |
| 6,159,788 A * | 12/2000 | Jenq et al. | 438/253 |
| 6,287,978 B1 | 9/2001 | Becker | |
| 6,309,975 B1 * | 10/2001 | Wu et al. | 438/705 |
| 6,337,244 B1 | 1/2002 | Prall | |
| 6,420,250 B1 | 7/2002 | Cho | |
| 6,420,786 B1 | 7/2002 | Gonzalez | |
| 6,501,114 B1 | 12/2002 | Cho | |
| 6,627,913 B1 | 9/2003 | Chen | |
| 6,664,611 B1 | 12/2003 | Chen | |
| 2002/0000423 A1 | 1/2002 | Becker | |

* cited by examiner

*Primary Examiner*—Thanhha S. Pham
(74) *Attorney, Agent, or Firm*—Leffert Jay & Polglaze, P.A.

(57) ABSTRACT

Methods and apparatus are described to facilitate forming memory devices with low resistance polysilicon local interconnects that allow a smaller array feature size and therefore facilitate forming arrays of a denser array format. Embodiments of the present invention are formed utilizing a wet etch process that has a high selectivity, allowing the deposition and etching of polysilicon local interconnects to source regions of array transistors. By providing for a local interconnect of polysilicon, a smaller source region and/or drain region can also be utilized, further decreasing the required word line spacing. Low resistance polysilicon local source interconnects can also couple to an increased number of memory cells, thereby reducing the number of contacts made to an array ground.

14 Claims, 6 Drawing Sheets

METHOD FOR FORMING POLYSILICON LOCAL INTERCONNECTS

TECHNICAL FIELD OF THE INVENTION

The present invention relates generally to integrated circuit devices and, in particular, to the formation of local polysilicon interconnects for a semiconductor memory device.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to read-only memory (ROM), which permits you only to read data. Most RAM is volatile, which means that it requires a steady flow of electricity to maintain its contents. As soon as the power is turned off, whatever data was in RAM is lost.

One other type of non-volatile memory is known as Flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

Memory device fabricators are continuously seeking to reduce the size of the devices. Smaller devices facilitate higher productivity and reduced power consumption. However, as device sizes become smaller, the sizes of various standard features become increasingly important. This is true in particular for semiconductor memory arrays where a small decrease in size of a feature can be magnified by being repeated throughout the array. One such repeated feature in memory arrays are local interconnect lines that can couple the local source, drains, and/or control gates of memory cells to the larger global source supply lines, bit lines, and word lines of the memory array. Two common manners for forming these local interconnect lines are depositing a line of polysilicon, metal, or similar conducting material into an insulated trench or diffusing a dopant into a substrate to form a conducting line. However, both of these approaches have exhibited issues that make them problematic in their reducing feature size; local interconnect lines formed of polysilicon or metal are often difficult and expensive to process in increasingly narrow trench areas and diffusing enough dopant to form a conduction line of a sufficiently low resistance can form deep and broad region junction areas that make it difficult to shrink the cell gate area.

For the reasons stated above, and for other reasons stated below which will become apparent to those skilled in the art upon reading and understanding the present specification, there is a need in the art for alternate methods and circuits for providing local interconnect connections to portions of a semiconductor memory device.

SUMMARY OF THE INVENTION

The above-mentioned problems with memory devices and other problems are addressed by the present invention and will be understood by reading and studying the following specification.

Various embodiments of the invention facilitate forming of low resistance polysilicon local interconnects that allow a smaller array feature size and therefore facilitate forming arrays of a denser array format. Embodiments of the present invention are formed utilizing a wet etch process that has a high selectivity, allowing the deposition and etching of polysilicon local interconnects to source and drain regions of array transistors. In addition, by forming local interconnects and contacts to the source regions of array elements with a high selectivity etch the size of the area dedicated to each interconnect line is reduced, thus allowing the use of a smaller pitch, i.e., a smaller spacing between adjacent word lines. By providing for a local interconnect of polysilicon, a smaller source region and/or drain region can also be utilized, further decreasing the required word line spacing. Low resistance polysilicon local source interconnects can also couple to an increased number of memory cells, thereby reducing the number of contacts made to an array ground.

For one embodiment, the invention provides a method of fabricating a source interconnect to a memory cell comprising forming a layer of dielectric material overlying a gate stack, a source region and a drain region of the memory cell, forming a first mask layer overlying the layer of dielectric material, patterning the first mask layer to expose a portion of the layer of dielectric material over at least the source region, removing a portion of the exposed portion of the layer of dielectric material to expose the source region, removing the first mask layer, forming a layer of polysilicon overlying the layer of dielectric material and in contact with the exposed source region, forming a second mask layer overlying the layer of polysilicon, patterning the second mask layer to expose a portion of the layer of polysilicon over at least the source region, implanting ions in the exposed portion of the layer of polysilicon, thereby forming an implanted portion of the layer of polysilicon and an non-implanted portion of the layer of polysilicon, removing the second mask layer, and selectively etching the layer of polysilicon to preferentially remove the non-implanted portion, thereby forming the source interconnect.

For another embodiment, the invention provides a method of fabricating a local interconnect comprising forming a dielectric layer having one or more trenches formed in it, depositing a layer of silicon-containing material over the dielectric layer, selectively implanting ions in one or more regions of the layer of silicon-containing material over the one or more trenches, and wet etching the layer of silicon-containing material to remove the non-implanted regions of the layer of silicon-containing material to form one or more local interconnect lines in the one or more trenches.

For yet another embodiment, the invention provides a method of fabricating a memory cell comprising forming a memory cell having a source and a source region and a drain region, and forming a local interconnect of polysilicon to contact to the source and/or drain region of the memory cell. Wherein forming a local interconnect of polysilicon comprises the steps of forming a dielectric layer over the memory cell having at least one contact hole to the source/drain region of the memory cell, depositing a layer of polysilicon overlying the dielectric layer to contact the source and/or drain region of the memory cell through the at least one contact hole of the dielectric layer, selectively implanting ions in one or more selected regions of the layer of polysilicon, and wet etching the layer of polysilicon to remove the non-implanted regions of the layer of polysilicon to form at least one polysilicon contact from the selected regions of the layer of polysilicon.

For a further embodiment, the invention provides a memory device comprising an array of floating-gate memory cells. The array of floating-gate memory cells comprising a plurality of rows of memory cells, each row coupled to a word line, a plurality of columns of memory cells, each column coupled to a bit line, a plurality of array source interconnects, each interconnect coupled to source regions of at least a portion of a row of memory cells, and a plurality of drain contacts, each drain contact coupled between a drain region of a memory cell and a bit line, wherein each array source interconnect comprises a polysilicon layer with an ion implanted top layer, where each array source interconnect is in contact with its associated source regions.

The invention further provides methods and apparatus of varying scope.

DETAILED DESCRIPTION OF THE INVENTION

In the following detailed description of the preferred embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims and their equivalents.

Embodiments of the present invention facilitate forming of low resistance polysilicon local interconnects that allow a smaller array feature size and therefore facilitate forming arrays of a denser array format. Memory devices and other integrated devices of the present invention are formed utilizing a wet etch process that has a high selectivity, allowing the deposition and etching of polysilicon local interconnects to source regions of array transistors. In addition, by forming local interconnects and contacts to the drain and source regions of array elements with a high selectivity etch, the size of the area dedicated to each interconnect line is reduced, thus allowing the use of a smaller pitch, i.e., a smaller spacing between adjacent word lines or memory cells. By providing for a local interconnect of polysilicon, a smaller source region and/or drain region can also be utilized, further decreasing the required word line spacing. Low resistance polysilicon local source interconnects can also couple to an increased number of memory cells, thereby reducing the number of contacts made to an array ground.

Figure 1A:
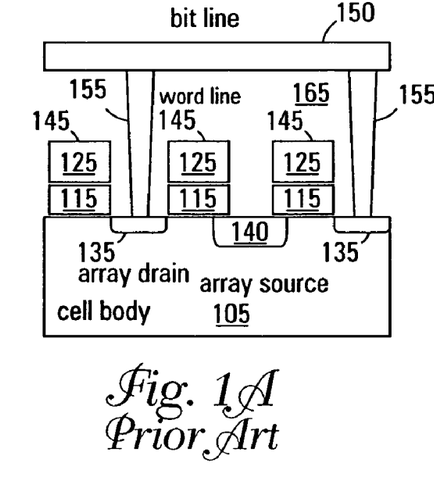
FIGS. 1A and 1B are cross-sectional views of a portion of a memory array of the prior art.
Figure 1B:
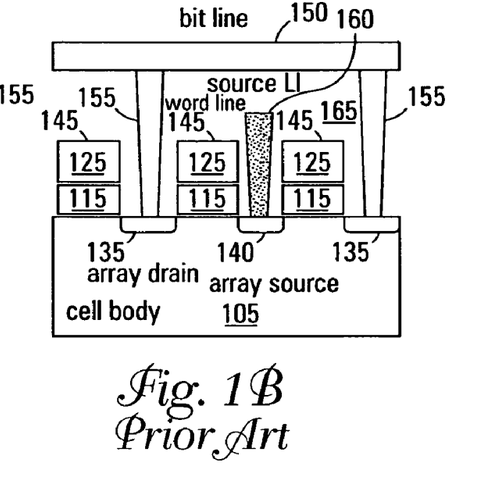

FIGS. 1A and 1B generally depict a simplified flash memory floating gate array of the prior art. Formation of the structure depicted in FIG. 1A is well known and will not be detailed herein. In general, FIG. 1A depicts several gate stacks 145 of layers that will form word lines of the memory array. The gate stacks 145 include a first conductive layer 115 is formed isolated in a dielectric 165 to form a floating gate. A second conductive layer 125 is formed overlying the first conductive layer 115 to form a control gate. The layers are patterned into stacks 145, as shown in FIG. 1A, and drain regions 135 and source regions 140 are formed in the substrate 105, such as by implantation or diffusion of dopant materials. In FIG. 1A, the flash memory array utilizes a source region 140 that has been deeply diffused into the substrate 105 to lower the source resistance and allow it to function as a source local interconnect. In FIG. 1A, a bit line 150 has been formed and bit line contacts 155 couple the bit line 150 to the drain regions 135 of the array. As detailed in FIG. 1A, the deep diffusion of the source region 140 to gain lower resistance levels has the undesirable effect of broadening the width of the source region 140, making it difficult to shrink the memory cell gate length and limiting the amount the array may be reduced in word line pitch size.

FIG. 1B depicts another flash memory array of the prior art that utilizes a local interconnect 160 that has been formed between the word line stacks 145 to contact the array source region 140 and function as a source local interconnect. In FIG. 1B, as with FIG. 1A, a bit line 150 has been formed and bit line contacts 155 couple the bit line 150 to the drain regions 135 of the array. The local source interconnects 160 of FIG. 1B are typically formed by a standard process method in which, after patterning the word line stacks 145 and depositing the insulating layer 165, a dry etch is utilized to form a trench or contact hole in the insulating layer 165 on the array source region 140. The trench or contact hole is then filled with doped polysilicon or metal. A problem with this is that the typical dry etch utilized against the insulating layer 165 does not have very good selectivity against the portion of the insulator 165 used to form the sidewalls and cap layer of the word line stacks 145 (not shown) and can dangerously thin them. As the cap layer and sidewall dielectric insulates the source local interconnect supply line 160 from the word line stack 145, if it is too thin it can break down when erase voltages (which can be as high as 16 v–20 v) are applied to the array, causing failure of the memory device. As a result, an insulating cap layer and the insulating sidewalls of the word line stacks 145 are over-designed to avoid this problem. As detailed in FIG. 1B, the local interconnects 160 and their insulating sidewalls and cap layers limit the amount the array may be reduced in word line pitch size without reducing the critical insulation separation of the interconnect 160 and the adjacent word line stacks 145. The additional insulation layer margin has the effect of limiting the amount of word line pitch reductions to avoid dangerously thinning the insulation layer 165 between the word line stacks 145 and the deposited interconnects 160.

In particular, the relatively low selectivity of the dry etch process can thin the insulating layer 165 at the top corners of the word line stack 145. Therefore, dry etch processes typically utilize a larger insulating layer 165 than electrically required to provide additional margin for the dry etch process and help avoid electrical break through. In addition, the complexity and cost of dry etch process is increased. This difficult local polysilicon formation process tends to increase fail rates in the completed memory arrays and decreases the resulting manufacturer's processing yield rates.

A wet etch process has been disclosed that allows polysilicon to be selectively etched between implanted and non-implanted regions. This wet etch process is detailed in U.S. Pat. No. 6,309,975, titled "Methods of making implanted structures", issued Oct. 30, 2001, which is commonly assigned. This wet etch method of polysilicon is not anisotropic and has a high etch selectivity allowing it to be advantageously used in embodiments of the present invention.

In general, the wet etch process operates by depositing a layer of silicon-containing material (such as polysilicon), masking it with a patterned resist layer, and then implanting the exposed areas of the silicon-containing material with ions to a selected threshold dosage level. After implanting the ions, the resist layer is stripped and the silicon-containing material is then wet etched to remove the excess material. One such chemical that can be utilized for the wet etch is dilute TMAH (tetramethyl ammonium hydroxide). The etch rate of the implanted regions of the silicon-containing material during the wet etch will be lower than the un-implanted regions, thus the silicon-containing material can be etched away from the un-implanted regions with a high rate of selectivity. In an alternative embodiment, a wet etchant is utilized that etches the implanted regions silicon-containing material at a higher rate than the un-implanted regions.

In the wet etch process a layer of silicon-containing material, which in one embodiment comprises polysilicon, is provided. A masking layer is formed on the layer of silicon-containing material that masks at least one region of the layer of silicon-containing material and leaves a second region of the layer of silicon-containing material unmasked.

Ions of a selected type are then implanted into the unmasked portion of the layer of silicon-containing material. The ions are of a type that is selected in accordance with an etching process which is selective to implanted silicon-containing material in a manner which will hereafter be discussed. In order to reduce the dimensions of the selected pattern from the dimensions of the masking layer, the ions can be implanted with an angle of implantation other than orthogonal to the semiconductor substrate, causing the ions to be implanted under the edges of the masking layer. Implanting the ions with an angle of implantation other than orthogonal to the semiconductor substrate will result in a reduction in the dimensions of the selected patterns from the dimensions of the masking layer, while an angle of implantation orthogonal to the surface of the semiconductor substrate results in no substantial dimension change. Other ion implantation parameters, such as ion type, implantation dose, and implantation energy can also be appropriately selected to further tailor the dimensions of the implanted region and thereby the resulting etched shape. The impermeability to ions of the selected masking material also has an effect in sculpting the resulting shaped structure. Diffusing the ions after ion implantation with a heat treatment deepens the penetration of the ions into the polysilicon layer and further serves to tailor the profile of the resultant shaped feature, though it is generally preferred not to heat treat in order to maintain a sharper profile of the implanted ions in the layer of silicon-containing material.

Additionally, in order to vary the dimensions in a uniform manner, the ion implantation operation can be conducted in multiple implantation stages with one ion implantation parameter being varied for each implantation stage. By varying the angle of implantation for each of the multiple implantation stages, for instance, deep shaped openings can be formed with substantially non-vertical sidewalls.

The masking layer in a subsequent procedure is stripped from the layer of silicon-containing material, and the layer of silicon-containing material is then etched with an etching process. The etching process etches portions of a volume of silicon-containing material that are not implanted with ions to a threshold concentration at a faster rate than the etching process etches portions of the volume of silicon-containing material that are implanted with ions up to the threshold concentration. Such an etching process is referred to herein as an etching process which is selective to implanted silicon-containing material. The exact concentration which constitutes the threshold concentration varies in accordance with the particular etching process and the etching process parameters. Nevertheless, for any such etching process, silicon-containing material implanted with ions beyond the threshold concentration is not substantially removed by the etching process which is selective to implanted silicon-containing material, and silicon-material implanted to less than the threshold concentration is substantially removed.

One example of an etching process which is selective to implanted silicon-containing material is a tetramethyl ammonium hydroxide (TMAH) wet etch. The TMAH wet etch is typically administered as an etchant solution into which the semiconductor wafer is immersed. Preferred concentrations of the TMAH wet etch etchant solution comprise from about 0.1 weight percent TMAH in a deionized water solution and higher. More preferably, a concentration from about 1 to about 10 weight percent TMAH in a solution, and most preferably about 2.5 weight percent TMAH in a solution can be used as the TMAH wet etch etchant solution. The TMAH wet etch is preferably conducted at a temperature in a range from about 5° C. to about 50° C., and more preferably, in a range from about 20° C. to about 30° C. Most preferably, the TMAH wet etch is conducted at about 30° C.

The TMAH wet etch has been found to etch silicon-containing material implanted to less than the threshold concentration of ions at least two times faster than it etches silicon-containing material that is implanted to the threshold concentration of ions. Differences in etch rates of 20 to one and 40 to one are easily achievable, and a difference in etch rates of up to 60 to one can be obtained as detailed in U.S. Pat. No. 6,309,975.

When conducting wet etch for polysilicon or other silicon-containing material, the threshold concentration of implanted ions at least to polysilicon is implanted is preferably in a range from about $1 \times 10^{15}$ ions per $cm^3$ of silicon-containing material to about $1 \times 10^{22}$ per $cm^3$ of silicon-containing material. More preferably, the threshold concentration is in a range from about $5 \times 10^{18}$ ions per $cm^3$ of silicon-containing material to about $5 \times 10^{20}$ ions per $cm^3$ of silicon-containing material. Most preferably, the threshold concentration is about $1 \times 10^{20}$ ions per $cm^3$ of silicon-containing material. Any relatively unimplanted portion is preferably substantially unimplanted with ions.

Common dopants such as boron, arsenic, and phosphorous are suitable for use as the implanted ions, and in addition, other common dopant ions and even ions that are not commonly considered to be dopant ions are satisfactory. For instance, ions can also be successfully used in conjunction with the TMAH wet etch that do not electrically activate or otherwise alter the electrical properties of the silicon-containing material. Examples of such ions are silicon ions and argon ions.

As a result of the etching process which is selective to implanted silicon-containing material, a selected portion of the polysilicon layer that is not implanted up to the threshold concentration of ions is etched away to form a shaped opening. Etching process parameters, such as the duration of the etch, can also be varied to further tailor the resulting etched pattern.

It is also noted that in an alternative embodiment of the present invention, an etched structure is formed from a layer of silicon-containing material on a semiconductor wafer with an etching process that, converse to the etching process of above, etches silicon-containing material that is implanted with ions up to a threshold concentration at a substantially faster rate than it etches silicon-containing material that is not implanted with ions up to the threshold concentration. In this, the layer of silicon-containing material is etched with an etching process which etches portions of the layer of silicon-containing material that are implanted with ions up to a threshold concentration at a substantially faster rate than it etches portions of the layer of silicon-containing material that are not implanted with ions up to the threshold concentration. Such etching processes are referred to herein as an etching process which is selective to unimplanted silicon-containing material. The concentration of ions which constitutes the threshold concentration is determined by the particular etching process which is selective to unimplanted silicon-containing material that is used and by the selection of the ion implantation and etching parameters in a manner that will be readily understood from this disclosure by those skilled in the art.

In one embodiment given by way of example, the etching process which is selective to unimplanted silicon-containing material uses an acidic etchant such as commercially available hydrofluoric acid, or it may use a nitric acid etchant solution. Also, a basic etchant, such as KOH etching chemistry can be used, together with a counter-implantation of the polysilicon layer.

Representative etch rates of implanted polysilicon illustrate that, at or around a concentration of $1 \times 10^{20}$ ions per $cm^3$ of silicon-containing material, the etch rate using the wet etch of the present invention begins to fall and continues to fall until an inflection point is reached at or around $1 \times 10^{20}$ ions per $cm^3$ of silicon-containing material. Accordingly, with typical implantation and etching parameters, the threshold concentration is between about $5 \times 10^{18}$ and about $5 \times 10^{20}$ ions per $cm^3$ of silicon-containing material. Of course, the implanted portion can be implanted with ions in excess of $5 \times 10^{20}$ ions per $cm^3$ of silicon-containing material, but the excess ions have not been found to substantially increase the selectivity to implanted portions of the silicon-containing material.

Figure 2A:
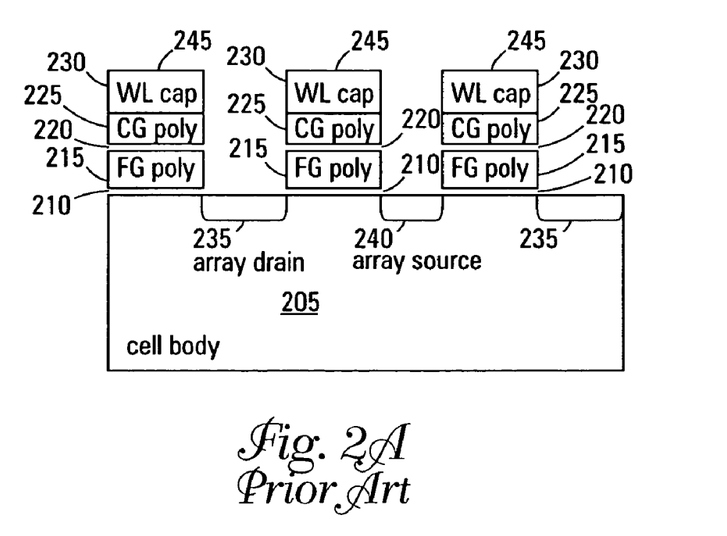
FIGS. 2A–2G are cross-sectional views of a portion of a memory array during various stages of fabrication in accordance with an embodiment of the invention.

FIGS. 2A–2G generally depict a method of forming a portion of a memory array in accordance with an embodiment of the invention. FIG. 2A depicts a portion of the memory array after several processing steps have occurred. Formation of the structure depicted in FIG. 2A is well known and will not be detailed herein. In general, FIG. 2A depicts several stacks 245 of layers that will form word lines of the memory array. It is noted that as embodiments of the present invention generally are formed or utilized after the word line stacks 245 have been formed, they are not limited to a particular gate 215, 225 or stack 245 configuration and that the memory array and stacks 245 shown in FIG. 2A are but one possible embodiment of the present invention.

The stacks 245 of FIG. 2A include a tunnel dielectric 210 formed on a substrate 205. A floating gate 215 is formed over the tunnel dielectric 210. The floating gate 215 is typically formed of a polysilicon layer. An intergate dielectric layer 220 is formed over the floating gate 215. A control gate 225 is formed overlying the dielectric layer 220. The control gate 225 also forms the word line conductor for the stack 245. In one embodiment, an insulating cap layer 230 is formed overlying the control gate layer 225. The layers are patterned into stacks, as shown in FIG. 2A, and drain regions 235 and source regions 240 are formed in the substrate 205, such as by implantation or diffusion of dopant materials. The drain regions 235 and source regions 240 will have the same conductivity type and be different from the conductivity type of the substrate 205.

In the array of FIG. 2A, the tunnel dielectric 210 is generally a silicon oxide, but may be any dielectric material. Some specific examples include silicon oxides ($SiO/SiO_2$), silicon nitrides ($SiN/Si_2N/Si_3N_4$) and silicon oxynitrides ($SiO_xN_y$). For one embodiment, substrate 205 is a P-type silicon substrate. The floating gate/first polysilicon layer 215 may be conductively doped. An example would be an n-type polysilicon layer. For one embodiment, the dielectric layer 220 contains the dielectric ONO (oxide-nitride-oxide). Other dielectric materials may be substituted for the ONO, such as tantalum oxide, barium strontium titanate, silicon nitride and other materials providing dielectric properties. The control gate 225 may generally be any conductor, but is typically formed of two conductors (a two layer word line), such as metal over polysilicon or a metal silicide over polysilicon. In this, the metal layer is generally formed over the entire length of the word line 225, and not just on the exposed portions of the underlying polysilicon layer. The second or control gate polysilicon layer 225 may also be conductively doped. In one silicide process, generally a layer of refractory metal, e.g., titanium (Ti), is formed overlying the entire structure and followed by an anneal. The metals of chromium (Cr), cobalt (Co), hafnium (Hf), molybdenum (Mo), niobium (Nb), tantalum (Ta), tungsten (W), vanadium (V) and zirconium (Zr) are generally recognized as other refractory metals. Where the refractory metal is in contact with a silicon layer, such as monocrystalline silicon or polysilicon, the refractory metal will react with the silicon to form a refractory metal silicide. Where the refractory metal is in contact with a layer not containing free silicon, e.g., silicon oxide, silicon nitride, TEOS, etc., the refractory metal will tend to remain unreacted during the anneal process. The unreacted refractory metal may then be selectively removed, such as by a wet strip, leaving behind the refractory metal silicide portions. The source/drain regions are also generally more heavily doped than the substrate 205. For one embodiment, the substrate 205 has a p-type conductivity while the drain regions 235 and source regions 240 have an $n^+$-type conductivity. While the drain regions 235 and source regions 240 were formed after formation of the word line stack for this embodiment, they could also be formed earlier.

Figure 2B:
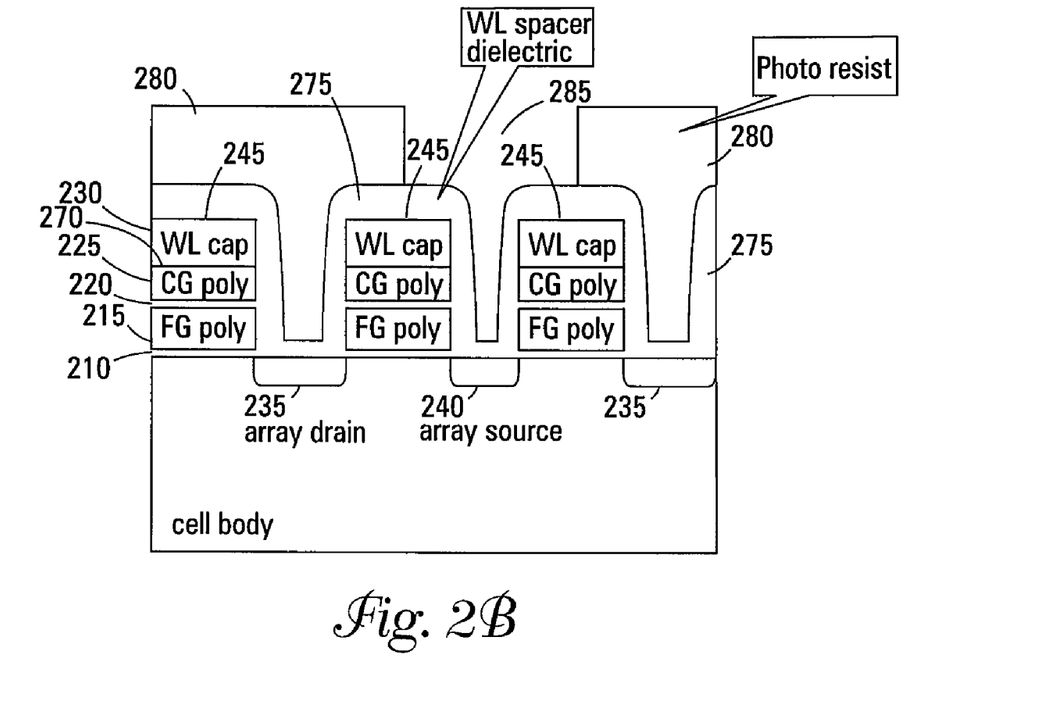
Figure 2C:
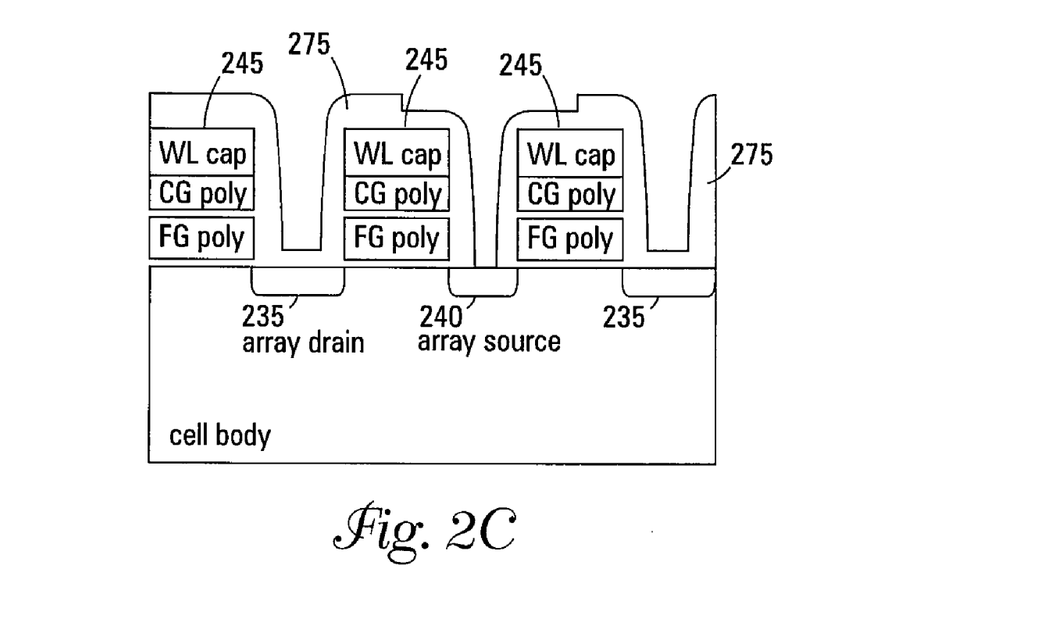

Once the stacks of FIG. 2A are formed, a layer of dielectric material 275, such as TEOS (tetraethylorthosilicate) or silicon nitride, is then formed by a blanket deposition process over the patterned word line stacks 245 as shown in FIG. 2B. The layer of dielectric material 275 is utilized to form the dielectric spacers 275 that separate and electrically insulate the word line stacks 245 from the local interconnect lines and contacts that are deposited later to connect to the drain regions 235 and source regions 240.

A mask layer 280 is then formed and patterned over the top of the dielectric spacer material 275. In FIG. 2B, a mask layer 280 is formed overlying the structure to define areas for removal of the insulator layer 275. As one example, the mask layer 280 is a patterned photoresist layer as is commonly used in semiconductor fabrication. The exposed areas of the insulator layer 275 are then removed in FIG. 2C such as by dry etching or other removal process. This exposes portions of the substrate 205 at one or more of the source regions 240 forming trenches. It is noted that trenches for the source regions 240 and contact holes for the drain regions 235 may be formed either together or separately using one or more separate mask and etch steps.

Figure 2D:
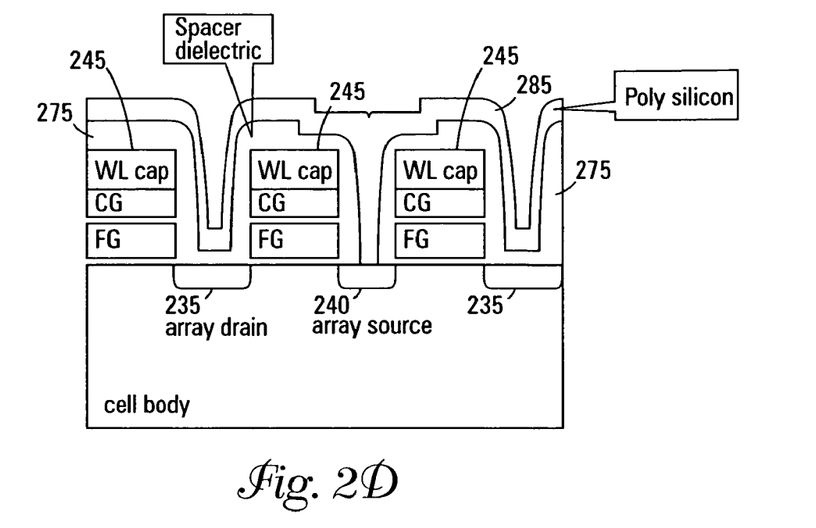

After the layer of photo resist 280 has been patterned and the exposed dielectric material 275 over the source regions 240 is etched to expose the source regions 240, the layer of photo resist 280 is then stripped off and a layer of polysilicon 285 is deposited over the dielectric spacer layer 275. The layer of polysilicon 285 may be conductively doped or undoped and will contact the exposed cell source regions 240. In one embodiment, the layer of polysilicon is deposited in a layer thick enough to pinch off in the trenches formed in the layer of dielectric spacer 275, as shown in FIG. 2D. In an alternative embodiment, pinch off of the polysilicon layer is enhanced by decreasing the spacing between the word lines 245 or other array features that define the trenches to be filled with polysilicon, for example, the spacing of the word lines 245 over the source region 240.

Figure 2E:
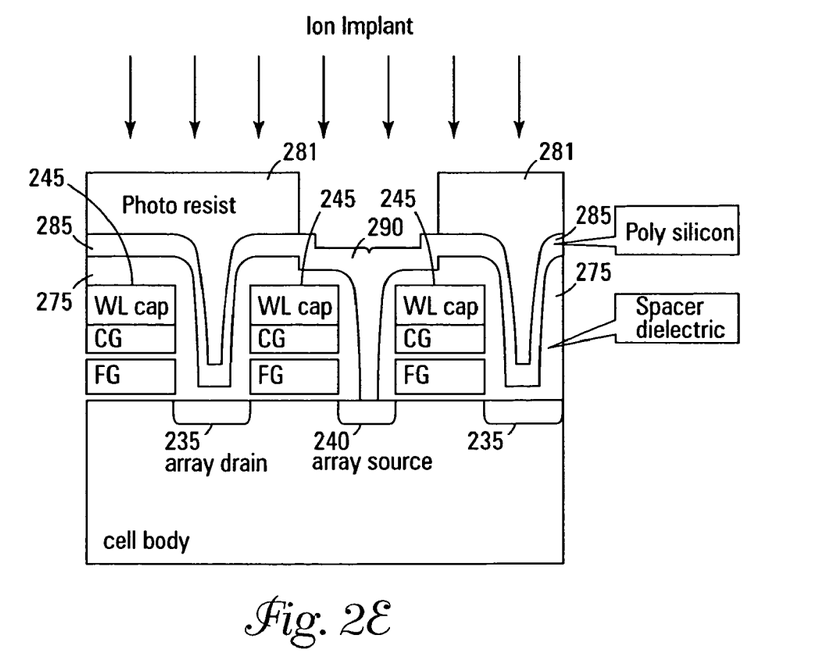
Figure 2F:
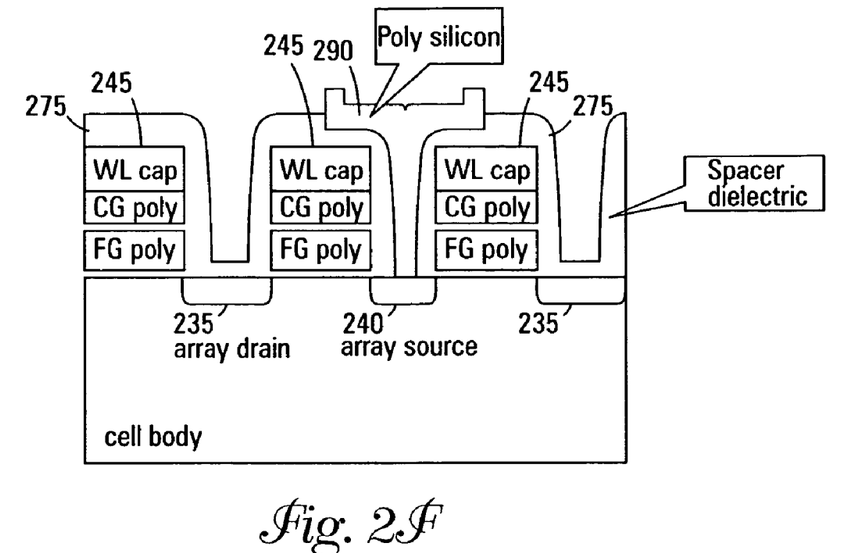

A second mask layer 281 is then placed over the top of the dielectric spacer material 275 and patterned to open slots in the mask layer 281 over the cell source regions 240. For one embodiment, second mask layer 281 and the mask layer of FIG. 2B are patterned with the same pattern. As described in U.S. Pat. No. 6,309,975, ions are then implanted into the exposed polysilicon 290, as shown in FIG. 2E. Examples of the implanted ion species include, but are not limited to boron, arsenic, phosphorous, argon, and silicon. The implant depth in one embodiment is set to be approximately one half the thickness of the polysilicon layer 285 to a selected dose level. The ion dosage level is typically selected to be in the range of $5 \times 10^{18}/cm^3 - 5 \times 10^{20}/cm^3$. The second mask layer 281 is then removed and the layer of polysilicon 285 is wet etched. One such chemical that can be utilized for the wet etch process is dilute TMAH. In one embodiment, the etch is a non-anisotropic etch, etching all surfaces evenly except for those surfaces that have been ion implanted. The ion implantation generates a wet etch selectivity (a slower etch rate) between the implanted polysilicon film 290 and non-implanted polysilicon film 285. This allows the non-implanted polysilicon 285 to be etched away and leave the implanted polysilicon 290 local interconnects coupled to the source region 240, as shown in FIG. 2F. In one embodiment, the second layer of photo resist is patterned and the polysilicon layer 285 is ion implanted such that a "T" shaped or a "Y" shaped local interconnect is formed in the trench that partially covers the corners of the adjacent word line stack 245. This allows the formed local interconnect to advantageously protect the spacer dielectric 275 on corners of the word line stacks 245 from potential thinning due to further processing and/or etching and has the additional beneficial effect of decreasing the resistance of the resulting local interconnect 290 by providing a larger cross sectional area. In addition, the T or Y shape also improves the edge definition of the local interconnect and limits undercutting of the local interconnect during etching. Contact formation to the local interconnect, and current carrying capacity of the interconnect line are promoted, and interconnect resistance is reduced by this interconnect shape. It is also noted that the word line cap 230 formed in one embodiment of the present invention increases insulation available on the top of the word line stack 245. This helps improve the insulation of the word line 245 and mitigates any stair step formation in the spacer insulation due to etching during the formation of the local interconnect.

Once the local interconnects 290 have been formed, a layer of insulating dielectric 265 such as a doped silicate glass, is deposited. Examples of doped silicate glasses include as BSG (borosilicate glass), PSG (phosphosilicate glass) and BPSG (borophosphosilicate glass). After the layer of insulating dielectric 265 is deposited, bit lines 295 and drain region contacts 293 are formed, and word lines 245 and source local interconnects 290 connected using, e.g., standard contact and metalization process steps, finishing the forming of the memory array and leaving the structure depicted in FIG. 2G.

Figure 2G:
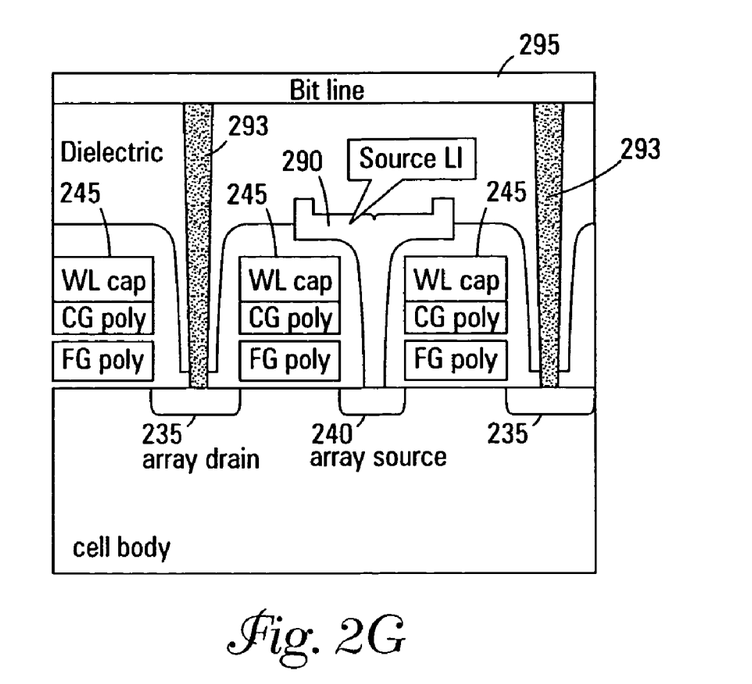

In embodiments of the invention, by utilizing a low resistance polysilicon local interconnect the source interconnect 290 can extend over a much larger group of memory cells in addition to allowing the reduction in word line pitch. This configuration can facilitate array source interconnects extending 32 columns or more without coupling to an array ground. In addition, by utilizing a shallow junction for the source region 240, a smaller channel can be utilized in the memory array, thus facilitating a reduction in device size and a reduction in pitch. As described herein, a memory cell is a single floating-gate transistor formed of a word line 225, drain region 235, source region 240 and a channel region defined by the area interposed between the drain region 235 and source region 240. It is also noted that the formation of bit line contacts utilizing the techniques are disclosed herein. However, in forming bit line contacts, the area of dielectric and polysilicon exposed over the drain region will typically be in the form of a contact hole rather than a trench.

Figure 3:
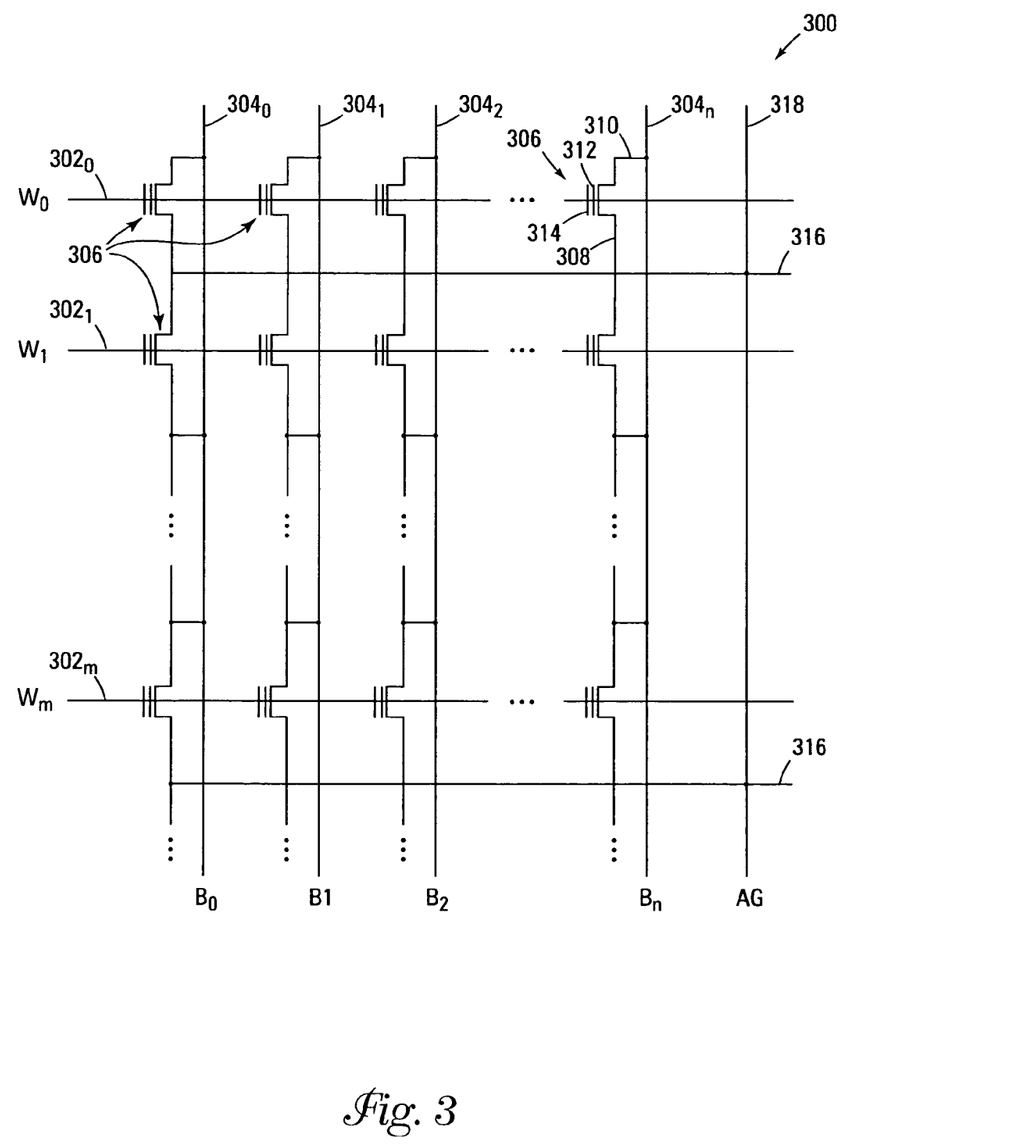
FIG. 3 is a schematic of a portion of a non-volatile memory array in accordance with an embodiment of the invention.

FIG. 3 is a schematic of a portion of a non-volatile memory array 300 as a portion of a memory device in accordance with one embodiment of the invention. The detail of memory array 300 is provided to better understand the various embodiments of the invention. The memory array 300 includes local interconnect lines formed in accordance with an embodiment of the invention.

The layout of FIG. 3 corresponds to one example of a NOR flash architecture. However, other types of memory arrays can benefit from embodiments of the invention. As one example, word lines, drain contacts and source interconnects can be fabricated in accordance with the invention for NAND flash architectures as well, although only one drain contact is required per string and only one source interconnect is required per block. Accordingly, the invention is not limited to the specific layout described with reference to FIG. 3.

As shown in FIG. 3, the memory block 300 includes word lines 302 and intersecting local bit lines 304. For ease of addressing in the digital environment, the number of word lines 302 and the number of bit lines 304 are each some power of two, e.g., 256 word lines 302 by 4,096 bit lines 304. The local bit lines 304 may be selectively coupled to global bit lines (not shown) for coupling to sense amplifiers (not shown in FIG. 3).

Floating-gate transistors 306 are located at each intersection of a word line 302 and a local bit line 304. The floating-gate transistors 306 represent the non-volatile memory cells for storage of data. Typical construction of such floating-gate transistors 306 include a source 308 and a drain 310 constructed from an $n^+$-type material of high impurity concentration formed in a P-type semiconductor substrate of low impurity concentration, a channel region formed between the source and drain, a floating gate 312, and a control gate 314. Floating gate 312 is isolated from the channel region by a tunneling dielectric and from the control gate 314 by an intergate dielectric. Floating-gate transistors 306 having their control gates 314 coupled to a word line 302 typically share a common source 308 depicted as array source interconnect 316. As shown in FIG. 3, floating-gate transistors 306 coupled to two adjacent word lines 302 may share the same array source interconnect 316. Floating-gate transistors 306 have their drains coupled to a local bit line 304. A column of the floating-gate transistors 306 are those transistors commonly coupled to a given local bit line 304. A row of the floating-gate transistors 306 are those transistors commonly coupled to a given word line 302.

The array source interconnects 316 may be coupled to a metal or other highly conductive line to provide a shared path to a ground potential node. The array ground 318 serves as this shared path. For one embodiment, a connection between an array source interconnect 316 and the array ground 318 occurs only once for each row of memory cells 306. Typical memory devices may require a contact between an array source interconnect and an array ground every 16 columns.

Figure 4:
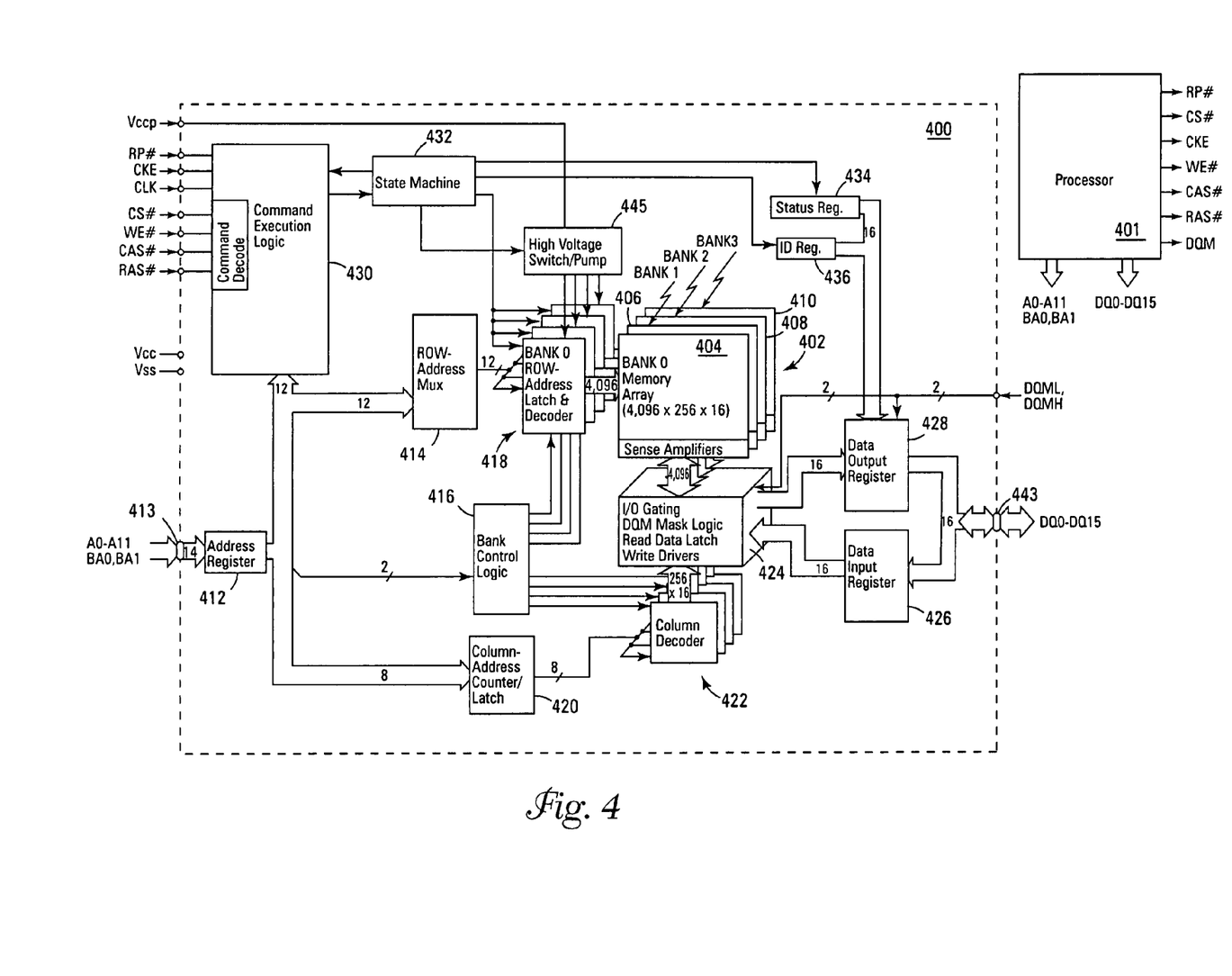
FIG. 4 is a functional block diagram of a basic flash memory device in accordance with an embodiment of the invention coupled to a processor.

FIG. 4 is a functional block diagram of a basic flash memory device 400 that is coupled to a processor 401. The memory device 400 and the processor 401 may form part of an electronic system. The memory device 400 has been simplified to focus on features of the memory that are helpful in understanding the present invention. The memory device 400 includes an array of non-volatile memory cells 402. The memory array 402 includes word lines formed in accordance with an embodiment of the invention.

Each memory cell is located at an intersection of a word line and a local bit line. The memory array 402 is arranged in rows and columns, with the rows arranged in blocks. A memory block is some discrete portion of the memory array 402. Individual word lines generally extend to only one memory block while bit lines may extend to multiple memory blocks. The memory cells generally can be erased in blocks. Data, however, may be stored in the memory array 402 separate from the block structure.

The memory array 402 is arranged in a plurality of addressable banks. In one embodiment, the memory contains four memory banks 404, 406, 408 and 410. Each memory bank contains addressable sectors of memory cells. The data stored in the memory can be accessed using externally provided location addresses received by address register 412 from processor 401 on address lines 413. The addresses are decoded using row address multiplexer circuitry 414. The addresses are also decoded using bank control logic 416 and row address latch and decode circuitry 418.

To access an appropriate column of the memory, column address counter and latch circuitry 420 couples the received addresses to column decode circuitry 422. Circuit 424 provides input/output gating, data mask logic, read data latch circuitry and write driver circuitry. Data is input through data input registers 426 and output through data output registers 428. This bi-directional data flow occurs over data (DQ) lines 443.

Command execution logic 430 is provided to control the basic operations of the memory device including memory read operations. A state machine 432 is also provided to control specific operations performed on the memory arrays and cells. A high voltage switch and pump circuit 445 is provided to supply higher voltages during erase and write operations. A status register 434 and an identification register 436 can also be provided to output data.

The memory device 400 can be coupled to an external memory controller, or processor 401, to receive access commands such as read, write and erase command. Other memory commands can be provided, but are not necessary to understand the present invention and are therefore not outlined herein The memory device 400 includes power supply inputs Vss and Vcc to receive lower and upper voltage supply potentials.

As stated above, the flash memory device 401 has been simplified to facilitate a basic understanding of the features of the memory device. A more detailed understanding of flash memories and memories in general is known to those skilled in the art. As is well known, such memory devices 401 may be fabricated as integrated circuits on a semiconductor substrate.

CONCLUSION

Method and apparatus have been described to facilitate forming of low resistance polysilicon local interconnects that allow a smaller memory array feature size and therefore facilitate forming arrays of a denser array format. Embodiments of the present invention are formed utilizing a wet etch process that has a high selectivity, allowing the deposition and etching of polysilicon local interconnects to source and drain regions of array transistors. In addition, by forming local interconnects and contacts to the source regions of array elements with a high selectivity etch the size of the area dedicated to each interconnect line is reduced, thus allowing the use of a smaller pitch, i.e., a smaller spacing between adjacent word lines. By providing for a local interconnect of polysilicon, a smaller source region and/or drain region can also be utilized, further decreasing the required word line spacing. Low resistance polysilicon local source interconnects can also couple to an increased number of memory cells, thereby reducing the number of contacts made to an array ground.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of fabricating a source interconnect to a memory cell, comprising:

forming a layer of dielectric material overlying a gate stack, a source region and a drain region of the memory cell;

forming a first mask layer overlying the layer of dielectric material;

patterning the first mask layer to expose a portion of the layer of dielectric material over at least the source region;

removing a portion of the exposed portion of the layer of dielectric material to form a trench shaped region and expose the source region;

removing the first mask layer;

forming a layer of polysilicon overlying the layer of dielectric material and trench shaped region to be in contact with the exposed source region;

forming a second mask layer overlying the layer of polysilicon;

patterning the second mask layer to expose a portion of the layer of polysilicon over at least the trench shaped region, wherein patterning the first and second mask layers further comprises patterning the first and second mask layers with the same pattern;

implanting ions in the exposed portion of the layer of polysilicon, thereby forming an implanted portion of the layer of polysilicon and an non-implanted portion of the layer of polysilicon;

removing the second mask layer; and selectively etching the layer of polysilicon to preferentially remove the non-implanted portion, thereby forming the source interconnect in the trench shaped region.

2. The method of claim 1, wherein forming the first and second mask layers further comprises forming at least one of the first and second mask layers with a photoresist.

3. The method of claim 1, wherein forming a layer of polysilicon overlying the layer of dielectric material and trench shaped region to be in contact with the exposed source region further comprises forming a layer of polysilicon overlying the layer of dielectric material and trench shaped region to be in contact with the exposed source region, wherein the layer of polysilicon is conductively doped.

4. The method of claim 1, wherein selectively etching the layer of polysilicon to preferentially remove the non-implanted portion, thereby forming the source interconnect further comprises selectively wet etching the layer of polysilicon to preferentially remove the non-implanted portion, thereby forming the source interconnect.

5. The method of claim 4, wherein wet etching further comprises wet etching with TMAH.

6. The method of claim 4, wherein wet etching further comprises wet etching with KOH.

7. The method of claim 1, wherein forming a layer of polysilicon overlying the layer of dielectric material and in contact with the exposed source region further comprises forming a layer of silicon-containing material overlying the layer of dielectric material and in contact with the exposed source region.

8. The method of claim 1, wherein patterning first mask layer further comprises patterning first mask layer to expose a portion of the layer of dielectric over the source region and a portion of the gate stack.

9. The method of claim 1, wherein patterning second mask layer further comprises patterning second mask layer to expose a portion of the layer of polysilicon over the source region and a portion of the gate stack.

10. The method of claim 1, wherein implanting ions further comprises implanting ions with a dosage level in the range of $1 \times 10^{15}$ ions per $cm^3$ to $1 \times 10^{22}$ ions per $cm^3$.

11. The method of claim 10, wherein the ion dosage level is in the range of $5 \times 10^{18}$ ions per $cm^3$ to $5 \times 10^{20}$ ions per $cm^3$.

12. The method of claim 1, wherein implanting ions further comprises implanting an ion species that is one of boron, phosphorous, arsenic, argon, and silicon.

13. The method of claim 1, wherein removing the first and second mask layers further comprises stripping at least one of the first and second mask layers.

14. The method of claim 1, wherein removing a portion of the exposed portion of the layer of dielectric material to expose the source region further comprises anisotropically etching the exposed portion of the layer of dielectric material.

* * * * *